(12) United States Patent
Yuge

(10) Patent No.: US 11,208,329 B2
(45) Date of Patent: Dec. 28, 2021

(54) PRODUCTION MEMBER AND PRODUCTION APPARATUS FOR CARBON NANOHORN AGGREGATE

(71) Applicant: NEC CORPORATION, Tokyo (JP)

(72) Inventor: Ryota Yuge, Tokyo (JP)

(73) Assignee: NEC CORPORATION, Tokyo (JP)

( * ) Notice: Subject to any disclaimer, the term of this patent is extended or adjusted under 35 U.S.C. 154(b) by 148 days.

(21) Appl. No.: 16/637,511

(22) PCT Filed: Aug. 10, 2017

(86) PCT No.: PCT/JP2017/029073
§ 371 (c)(1),
(2) Date: Feb. 7, 2020

(87) PCT Pub. No.: WO2019/030890
PCT Pub. Date: Feb. 14, 2019

(65) Prior Publication Data
US 2020/0216321 A1    Jul. 9, 2020

(51) Int. Cl.
*C01B 32/18* (2017.01)
*B01J 23/745* (2006.01)
(Continued)

(52) U.S. Cl.
CPC ............. *C01B 32/18* (2017.08); *B01J 23/745* (2013.01); *B82Y 30/00* (2013.01); *B82Y 40/00* (2013.01)

(58) Field of Classification Search
CPC ..... C01B 32/18; C01B 32/158; C01B 32/159; C01B 32/16; C01B 32/162; C01B 32/164;
(Continued)

(56) References Cited

U.S. PATENT DOCUMENTS 5,876,684 A * 3/1999 Withers ................. C01B 32/15
423/445 B
2006/0133979 A1   6/2006 Azami et al.
(Continued)

FOREIGN PATENT DOCUMENTS

JP      2001-168061 A    6/2001
JP      2005-350275 A    12/2005
(Continued)

OTHER PUBLICATIONS

English Translation of Written Opinion of the International Searching Authority for PCT/JP2017/029073 dated Oct. 24, 2017 (Year: 2017).*

(Continued)

*Primary Examiner* — Daniel C. McCracken
(74) *Attorney, Agent, or Firm* — Sughrue Mion, PLLC

(57) ABSTRACT

In order to provide a means for industrially producing a fibrous carbon nanohorn aggregate (CNB), a production member is used which is a combination of a plurality of carbon targets containing a metal catalyst selected from Fe, Ni, Co or a single substance or a mixture of these two or three substances capable of generating carbon nanohorn aggregates including the fibrous carbon nanohorn aggregate by laser irradiation, and a target fixing jig for fixing the carbon target, wherein the target fixing jig has a plurality of grooves for fixing the target to a plate-shaped member, the carbon target has a thickness of a height equal to or greater than the top surface of the fixing jig from the groove, and the width of the carbon target is larger than the size of the spot of the laser beam in the width direction.

9 Claims, 4 Drawing Sheets

(51) Int. Cl.
*B82Y 30/00* (2011.01)
*B82Y 40/00* (2011.01)

(58) Field of Classification Search
CPC ..... C01B 32/166; C01B 32/168; C01B 32/17; C01B 32/172; C01B 32/174; C01B 32/176; C01B 32/178; C01B 2202/00; C01B 2202/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/30; C01B 2202/32; C01B 2202/34; C01B 2202/36; B01J 23/745; B82Y 30/00; B82Y 40/00; C04B 35/52; C23C 14/00; D01F 9/12; D01F 9/127; D01F 9/1271; D01F 9/1272; D01F 9/1273; D01F 9/1274; D01F 9/1275; D01F 9/1276; D01F 9/1277; D01F 9/1278; D01F 9/133
See application file for complete search history.

(56) References Cited

U.S. PATENT DOCUMENTS

2006/0147647 A1 7/2006 Azami et al.
2007/0003468 A1 1/2007 Azami et al.

FOREIGN PATENT DOCUMENTS

| JP | 4581997 B2 | 11/2010 |
| WO | 2004/069743 A1 | 8/2004 |
| WO | 2004/096705 A1 | 11/2004 |
| WO | 2016/147909 A1 | 9/2016 |

OTHER PUBLICATIONS

International Search Report for PCT/JP2017/029073 dated Oct. 24, 2017 (PCT/ISA/210).

* cited by examiner (a)     (b)

(a)     (b)

(a)     (b)

PRODUCTION MEMBER AND PRODUCTION APPARATUS FOR CARBON NANOHORN AGGREGATE

CROSS REFERENCE TO RELATED APPLICATIONS

This application is a National Stage of International Application No. PCT/JP2017/029073 filed Aug. 10, 2017.

TECHNICAL FIELD

The present invention relates to a production member and a production apparatus for carbon nanohorn aggregates including a fibrous carbon nanohorn aggregate.

BACKGROUND ART

Conventionally, carbon materials are utilized as conductive materials, catalyst carriers, adsorbents, isolators, inks, toners, etc., and in recent years, the appearance of nanocarbon materials having nano-size such as carbon nanotubes, carbon nanohorn aggregates, etc. have attracted attention as features as their structures.

The present inventor has found, unlike conventional globular carbon nanohorn aggregates (referred to as CNHs), a fibrous carbon nanohorn aggregates (carbon nanobrush: referred to as CNB) composed of radially assembled carbon nanohorns and having a fiber-like elongated structure (Patent Document 1). CNB is produced by laser ablation, while rotating the carbon target containing a catalyst (Patent Document 1).

Further, an apparatus for producing a conventional CNHs is disclosed in Patent Document 2. The apparatus of Patent Document 2 includes a production chamber configured to irradiate a solid carbon material with a laser beam in an atmosphere of inert gas to produce a product including carbon nanohorns, a graphite component and an amorphous component, and a separation mechanism configured to separate the carbon nanohorns from the graphite component and the amorphous component. Further, it is described that the carbon nanohorn is obtained as an aggregate having diameters of about 50-150 nm (the CNHs herein).

PRIOR-ART LITERATURE

Patent Document

Patent Document 1: WO2016/147909 Publication
Patent Document 2: Japanese Patent No. 4581997

SUMMARY OF INVENTION

Technical Problems

CNB is obtained by laser irradiation of a carbon target containing a catalyst, and both CNB and CNHs are produced. At this time, the proportion of CNB in the product is very small, and the method to produce CNB industrially has not been established.

In particular, since the catalyst of the target in the vicinity of the laser irradiation mark evaporates and a deteriorated layer of carbon is formed by heat, CNB cannot be continuously generated. Since the target in the vicinity of the irradiation mark cannot be used, the target cannot be used efficiently, and it is difficult to reduce the cost. Further, since the catalyst in the vicinity of the irradiation mark evaporates, more catalyst may exist in the CNB formed than necessary.

It is an object of the present invention to provide a production member including a fixing jig provided with a target for industrially producing CNB, and an apparatus including the production member.

Solution to Problem

That is, according to one aspect of the present invention, there is provided a production member including a combination of a plurality of carbon targets containing a metal catalyst selected from a single substance of Fe, Ni, Co or a mixture of two or three kinds thereof, which can manufacture a carbon nanohorn aggregate containing a fibrous carbon nanohorn aggregate by irradiation of a laser beam, and a target fixing jig for fixing the plurality of the carbon targets, wherein the target fixing jig has a plurality of grooves for fixing the target to a plate-shaped member, the carbon target has a thickness of a height equal to or greater than the upper surface of the fixing jig from the groove, and the width of the carbon target is larger than the size of the spot of the laser beam in the width direction.

According to an aspect of the present invention, there is provided a method of producing carbon nanohorn aggregates including a fibrous carbon nanohorn aggregate using the above-mentioned production member, the method including:

disposing the production member in a production chamber in which a non-oxidizing atmosphere can be maintained, introducing a gas which maintains the non-oxidizing atmosphere in the production chamber, continuously irradiating the carbon target fixed to the groove of the fixing jig with a line of laser beam, and then continuously irradiating the carbon target not irradiated with the laser beam fixed to the adjacent groove with a line of laser beam, and collecting a product produced by the irradiation of the laser beam by the flow of the gas.

According to another aspect of the present invention, there is provided a production apparatus of carbon nanohorn aggregates including a fibrous carbon nanohorn aggregate, the apparatus including: a production chamber in which the production member is movably mounted and in which the inside can be maintained in a non-oxidizing atmosphere; an irradiation unit irradiating laser beam to the carbon target in the production chamber; a movement unit moving the production member in the extending direction of the groove and moving the irradiation position of laser beam to an adjacent groove when irradiation of laser beam to the carbon target in one groove is completed; and collecting unit collecting carbon nanohorn aggregates including the fibrous carbon nanohorn aggregate generated by irradiating the carbon target with laser beam.

Effects of Invention

According to one aspect of the present invention, there is provided a production member which is a combination of a target and a fixing jig for industrially manufacturing a fibrous carbon nanohorn aggregate (CNB), and a production apparatus which mounts the production member.

DESCRIPTION OF EMBODIMENT

Hereinafter, example embodiments of the present invention will be described.

Figure 6:
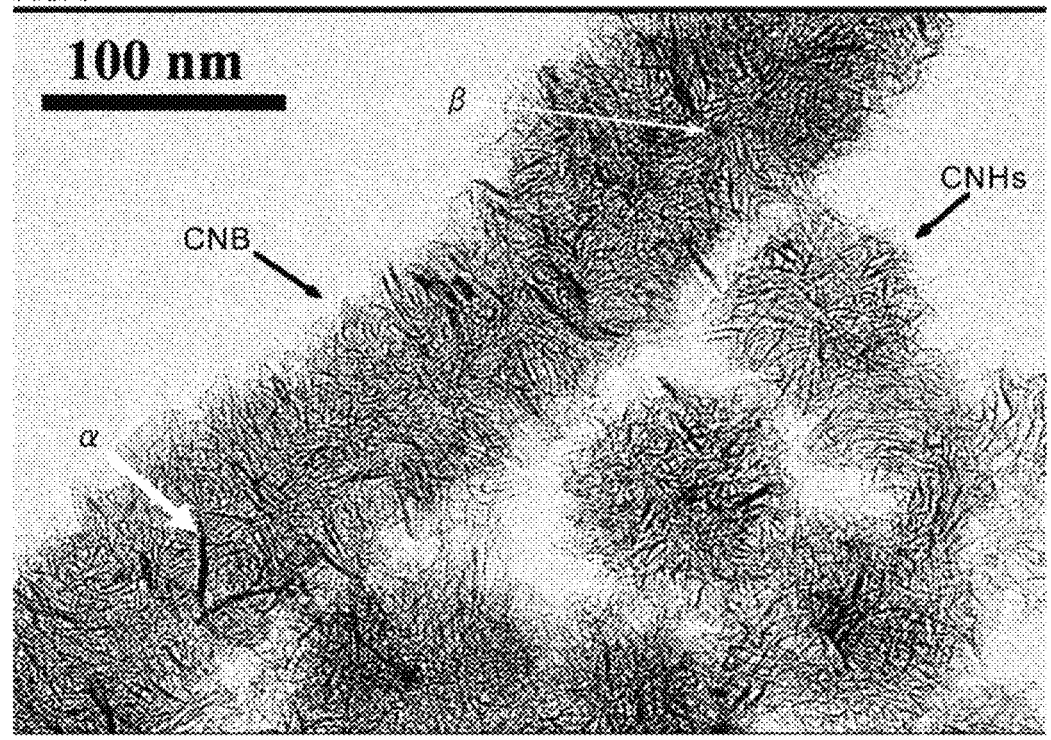
FIG. 6 is a transmission electron micrograph of a fibrous carbon nanohorn aggregate and a spherical carbon nanohorn aggregate produced according to an example embodiment.
Figure 7:
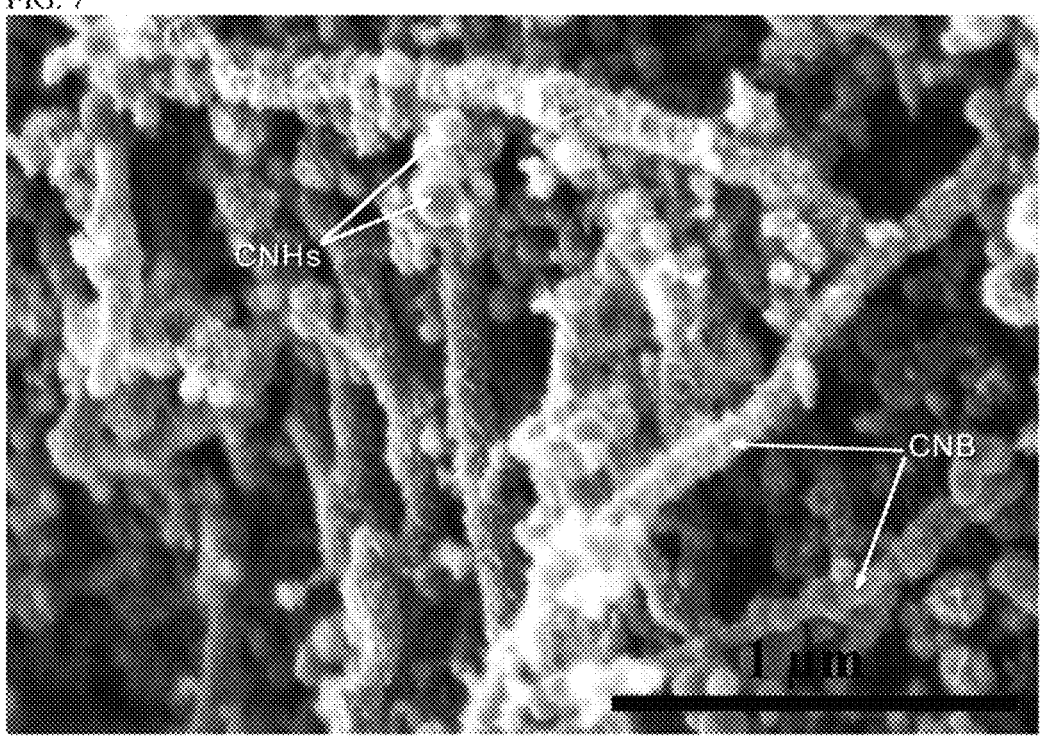
FIG. 7 is a scanning electron micrograph of a fibrous carbon nanohorn aggregate and a spherical carbon nanohorn aggregate made according to an example embodiment.

FIG. 6 is a transmission electron microscopic (TEM) image of a fibrous carbon nanohom aggregate (CNB) and globular carbon nanohoms (CNHs) fabricated according to an example embodiment of the present invention. FIG. 7 is a scanning electron microscopic (SEM) image. CNB has a structure in which a seed-shaped, a bud-shaped, a dahlia-shaped, a petal dahlia-shaped and/or a petal-shaped (a graphene sheet structure) carbon nanohom aggregates are one-dimensionally connected. That is, CNB has a structure in which single-walled carbon nanohoms are radially assembled and elongated in a fiber shape. Thus, a fibrous structure contains one or more of these carbon nanohom aggregates. In addition, carbon nanotubes (CNTs) may be included in the interior of the fibrous carbon nanohom aggregates. This is due to the formation mechanism of the fibrous carbon nanohorn aggregate according to the present example embodiment as follows.

That is, (1) a catalyst-containing carbon target is rapidly heated by laser irradiation, thereby vaporizing the carbon and catalyst from the target at once and forming a plume by high-density carbon evaporation. (2) At that time, carbon forms carbon droplets of a certain size by collision with each other. (3) In the diffusion process of the carbon droplets, they are cooled gradually to form graphitization of carbon, resulting in the formation of tube-shaped carbon nanohoms. Carbon nanotubes also grow from the catalyst dissolved in the carbon droplets at this time. Then, (4) radial structures of the carbon nanohoms are connected one-dimensionally with the carbon nanotube as a template, and thereby the fibrous carbon nanohom aggregates are formed."

The non-transparent particles in FIG. 6 show metals derived from the metal catalyst-containing carbon material used. In the following description, fibrous and globular carbon nanohorn aggregates are collectively referred to simply as carbon nanohorn aggregates.

The diameter of each of the carbon nanohorns (referred to as single-walled carbon nanohorns) including the carbon nanohorn aggregate is approximately 1 nm to 5 nm, and the length is 30 nm to 100 nm. CNB has a diameter of about 30 nm to 200 nm, it is possible to length of about 1 μm to 100 μm. On the other hand, CNHs has approximately uniform size in diameters of about 30 nm to 200 nm.

The CNHs obtained simultaneously is formed in a seed-shaped, a bud-shaped, a dahlia-shaped, a petal dahlia-shaped and/or a petal-shaped one singly or in combination thereof. The seed-shaped one has almost no or no angular projections on its globular surface; the bud-shaped one has slightly angular projections on its globular surface; the dahlia-shaped one is a shape having many angular projections on its globular surface; and the petal-shaped one is a shape having petal-like projections on its globular surface a graphene sheet structure). The petal-dahlia-shaped one has an intermediate structure between the dahlia-shaped one and the petal-shaped one. CNHs is generated in a mixed state with CNBs. Morphology and particle size of the CNHs produced can be adjusted by the type and flow rate of the gases.

Incidentally, CNB and CNHs can be separated by utilizing a centrifugal separating method or a difference in settling rate after dispersing in solvents. In order to maintain the dispersibility of CNB, it is preferable to use them as they are without separating from the CNHs. CNB obtained in the present example embodiment is not limited to only the above structure if the single-walled carbon nanohorn is assembled in a fiber shape. Incidentally, the term "fibrous" herein refers to one that can maintain its shape to some extent even by performing the above-described separating operations, and is simply different from one in which a plurality of CNHs is arranged in a series and appear to be fibrous at a glance. Further, in the particle size distribution measurement by the dynamic light scattering measurement, CNB can confirm the peak in the particle size region which clearly differs from the CNHs.

CNB has high dispersibility compared to other carbon materials having acicular structures, such as carbon fibers and carbon nanotubes. Further, since both of CNB and CNHs have a radial structure, there are many contacts at the interface, and they are firmly adsorbed to each other and strongly adsorbed to other material members.

First Example Embodiment

Figure 1:
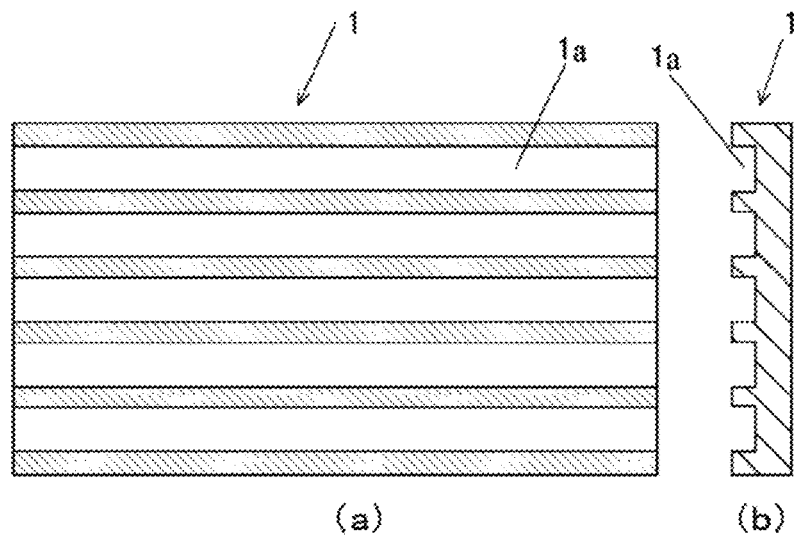
FIG. 1 is a schematic view of a target fixing jig for manufacturing a carbon nanohorn aggregate according to an embodiment of the present invention, wherein (a) is a plan view and (b) is a side view.
Figure 2:
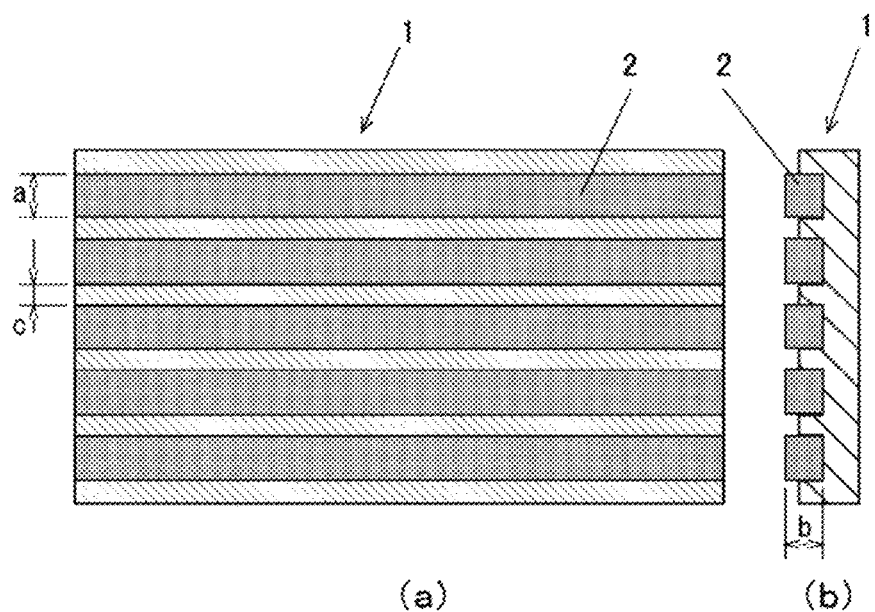
FIG. 2 is a schematic view of a production member that combines a target for manufacturing a carbon nanohorn aggregate and a target fixing jig according to an embodiment of the present invention, wherein (a) is a plan view and (b) is a side view.

FIG. 1 is a plan view and a side view showing a target fixing jig 1 for manufacturing the CNB according to a first example embodiment of the present invention. The fixing jig according to the present example embodiment has a plurality of grooves 1a for fixedly holding targets with respect to a flat plate-shaped base material. As shown in FIG. 2, carbon targets 2 containing catalysts for producing CNBs are fixed to the respective grooves 1a. Here, the width a of the groove 1a, which is a basis of the width of the target 2, is set so that the base material of the target fixing jig 1 is not irradiated with the laser beam. That is, the width of the target is set to be larger than the irradiation region of the laser beam to be irradiated as described later. The width a can be set to an arbitrary value, but for example, the width a can be set to a width of 1 mm to 20.5 mm. Further, the width of the carbon target 2, by fitting slightly smaller than the width a of the groove 1a of the fixing jig 1, it is possible to facilitate removal. For fixing, a surface other than the target surface irradiated with the laser beam, for example, both end surfaces in the longitudinal direction of the prism can be fixed by a known method such as fixing with claws or the like provided in the fixing jig 1. The thickness b of the target can be set to an arbitrary value, but it is preferable that the thickness is set to such an extent that all of the target is evaporated by one irradiation of the laser beam, and can be set to, for example, a thickness of 1 to 20 mm. Here, the depth of the groove 1a and the thickness b of the carbon target 2 are set so that the thickness of the carbon target 2 becomes equal to or higher than the height of the upper surface of the fixing jigs 1 from the groove 1a.

The base material of the target fixing jig 1 is preferably made of a material having a good heat dissipation property, and can include, for example, a metal selected from stainless steel, copper (Cu), aluminum (Al), tungsten (W), molybdenum (Mo), and chromium (Cr), an alloy containing these metals, ceramics, diamond, or a composite with these metals or alloys. The distance c between adjacent targets is not particularly limited, but is preferably narrow from the viewpoint of placing as many targets as possible on one flat plate-shaped fixing jig 1. However, from the viewpoint of reducing the influence of heat from an adjacent target, it is also preferable to open a certain distance. For example, the distance c can range from 1 to 10 mm.

As described above, by arranging the grooves of the fixing jig composed of the base material having good heat dissipation property at predetermined intervals, when the target is heated by the irradiation of the laser beam, the generated heat is dissipated before reaching another target arranged in the adjacent groove, and does not affect the unused target.

Figure 5:
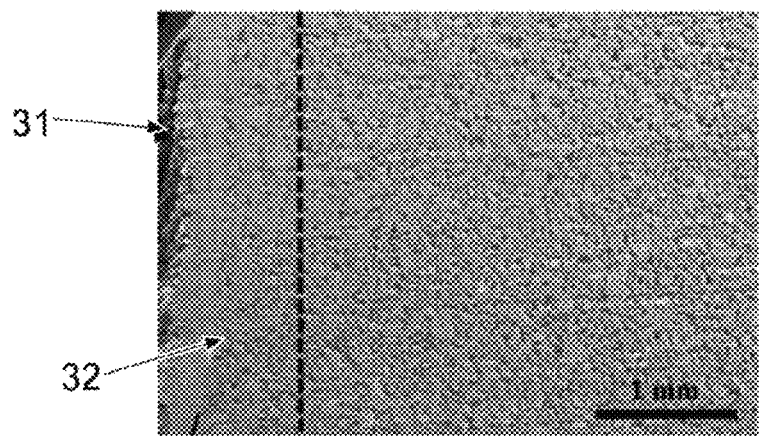
FIG. 5 is a scanning electron microscope image showing a deteriorated region when a sheet-like target is irradiated with a laser beam.

In the case where a single sheet-like target is used without being arranged in such a groove, it is conceivable to irradiate a plurality of rows with a laser beam. However, in the method in which the carbon target is irradiated with a laser beam by laser ablation and is evaporated, the peripheral portion irradiated with the laser beam is also thermally affected, and the carbonaceous crystal state, the distribution of the catalyst metal, and the like are changed (referred to as an altered region). FIG. 5 shows an example of the altered region 32 of the target 2 after the laser irradiation. Up to the dotted line portion of the scanning electron microscope image of FIG. 5, it is considered that there is an influence on the target after the irradiation, and in the present invention, this region is defined as the altered region.

Figure 3:
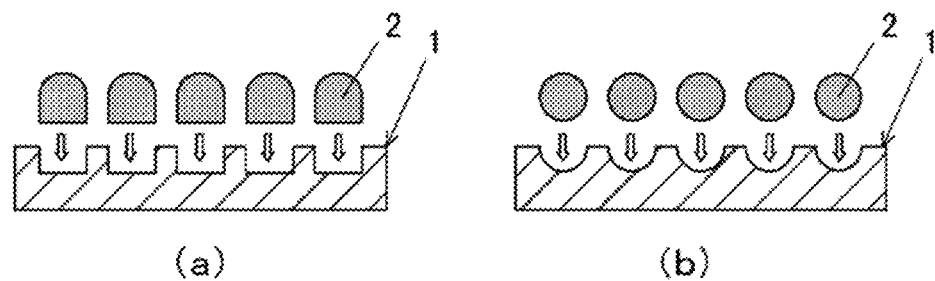
FIG. 3 is a schematic diagram illustrating another example of a production member according to an embodiment of the present invention.

In FIG. 2, a prismatic target is shown as the target 2 placed on the groove 1a of the fixing jig 1, but the shape of the target is not limited to the prismatic shape. For example, as shown in FIG. 3, a semi-cylindrical semi-prismatic (kamaboko-like) target or a cylindrical target can be used. The shape of the groove of the fixing jig 1 may be any shape as long as the target to be used can be fixed. In FIG. 3, the groove 11 is provided so as to conform to the shape of the bottom surface of the target 2, but the groove 11 is not limited to this, and may be a polygonal shape such as a triangular shape or a pentagonal shape.

Figure 4A:
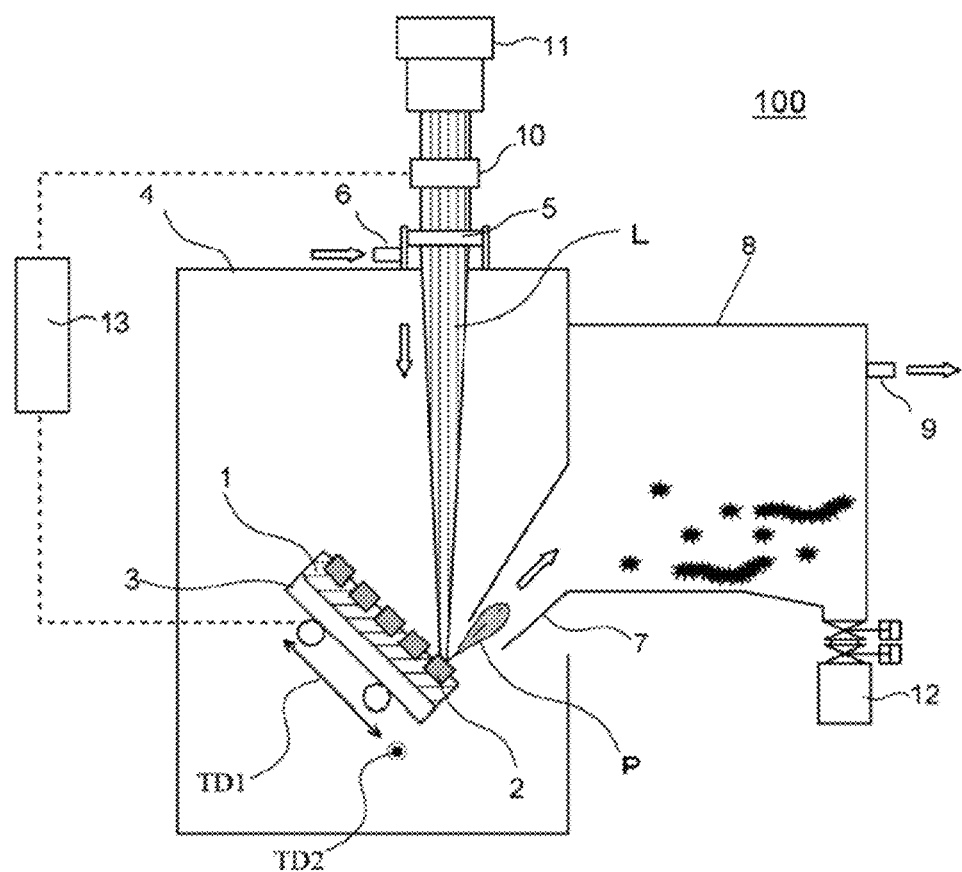
FIGS. 4(a) and 4(b) are a schematic side view FIG. 4(a) and a perspective view FIG. 4(b) of a manufacturing apparatus on which a production member according to an embodiment of the present invention is mounted, showing the outline at the time of laser beam irradiation.

FIG. 4(a) is a diagram showing an outline of a production apparatus for manufacturing CNB using a combination of a target and a fixing jig according to the present example embodiment. The apparatus is an apparatus for manufacturing a carbon nanohorn aggregate including CNB by irradiating a carbon target 2 containing a metal catalyst selected from Fe, Ni, Co or a mixture of two or three thereof with a laser beam L to evaporate carbon as a plume P in a non-oxidizing atmosphere such as a nitrogen gas or a noble gas (Ar or the like). The apparatus comprises a production chamber 4 for producing carbon nanohorn aggregates, and a collection chamber 8 connected to the production chamber 4 by a transfer tube 7.

The production chamber 4 is provided with a moving unit 3 for moving the target fixing jig 1 holding the carbon target 2, which contains the metal catalyst, in the moving direction TD1 of the target fixing jig 1. Further, the movement unit 3 can move the carbon target 2 in the moving direction TD2 of the back from the front of the figure.

The production chamber 4 has a laser irradiating window 5 (e.g., a ZnSe window) for irradiating the targets 2 in the production chamber 4 with a laser beam L from a laser oscillator 11 (e.g., a carbon dioxide laser oscillator). Between the laser oscillator 11 and the laser irradiating window 5, a laser focal position adjusting mechanism 10 (e.g., a ZnSe lens) for focusing the laser beam at a predetermined position is provided.

Further, a gas pipe (not shown) is connected to the production chamber 4 to introduce a non-oxidizing gas (nitrogen gas or a noble gas such as Ar gas) into the production chamber 4, and is connected to a gas cylinder (not shown). Here, a gas is introduced from an inlet 6 connected to a space in which the laser irradiation window 5 is provided, and a flow toward the target 2 is formed together with the laser beam.

An exhaust port 9 is provided in the collection chamber 8, and the product is collected from the production chamber 4 to the collection chamber 8 along the flow of the gas.

Figure 4B:
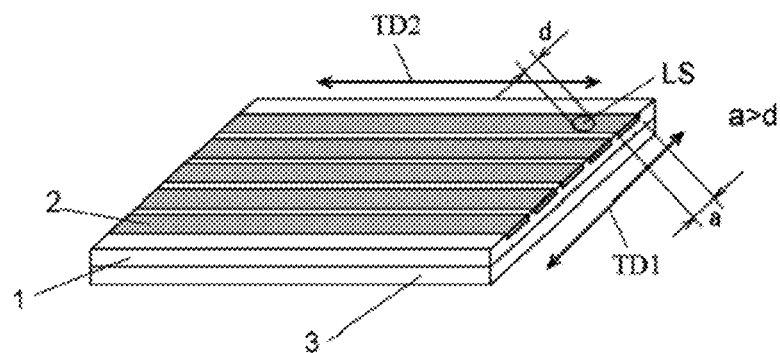

A collection container 12 for collecting the carbon nanohorn aggregate including the generated CNB is attached to the collection chamber 8 via a valve. In addition, a bag filter (not shown) is attached to the collection chamber 8 so that the carbon nanohorn aggregate including the generated CNB does not go to the exhaust port 9. FIG. 4(b) is a perspective view for explaining laser irradiation to the target 2. When the target 2 is irradiated with a laser beam, a laser spot LS is formed. Assuming that the size of the laser spot in the target width direction is d, the width a of the target has a relationship of a>d. In reality, the laser beam is irradiated so that the center axis of the target coincides with the center of the laser spot so that the target remains slightly on both sides of the laser spot.

In the production chamber 4, it is preferable to move so that the power density of the laser beam L irradiated onto the surface of the target 1 is substantially constant. At this time, if the moving speed of the laser spot is too low, the raw material cannot be evaporated from the target and precipitates as a deposit on the target. The precipitates are mainly graphite or carbon nanotubes, and some CNHs is generated but CNBs are not generated. Although not clear in detail, it is believed that the slightly evaporated raw material is consumed in the production of CNHs so that CNBs are not produced. Further, even if the moving speed becomes too high, the product becomes mainly CNHs, and CNB is not generated. Therefore, the moving speed is appropriately set to be optimum in accordance with the laser power, the spot diameter of the laser, and the catalyst amount of the catalyst-containing carbon target. For example, it can be set in the range of 0.05 cm/sec to 10 cm/sec.

Here, "to move the laser irradiation position so that the power density of the laser beam is substantially constant", by the irradiation position of the laser beam (spot) is gradually moved at a constant speed, a substantially constant power density.

For laser ablation, $CO_2$ laser, excimer laser, YAG laser, semiconductor laser, etc., can be appropriately used as long as the target can be heated to a high temperature. $CO_2$ laser whose output can be easily increased is most suitable. The output of the $CO_2$ laser can be appropriately utilized, but preferably an output of 1.0 kW to 10 kW, and more preferably an output of 2.0 kW to 5.0 kW. If it is smaller than this range, since almost the target does not evaporate, undesirable from the viewpoint of the amount produced. If it is greater than this range, it is undesirable because the impurities such as graphite and amorphous carbon increases. In addition, the laser can be performed with continuous irradiation and pulse irradiation. For mass production, continuous irradiation is preferred.

The spot diameter of the laser beam can be selected from a range in which the irradiated area is about 0.02 cm$^2$ to 2 cm$^2$, that is, a range of 0.5 mm to 5 mm. Here, the irradiation area can be controlled by the laser output and the degree of condensation at the lens. Note that this spot diameter typically means a diameter in an irradiation region (circle) when a laser beam is irradiated to a single point perpendicularly to a target surface forming a plane. When the surface of the target is not a plane surface or when the target surface is inclined as described below, the shape of the spot is not a circle, but, for example, is substantially an ellipse, whose minor axis passing through the spot center of the laser beam is substantially equal to the diameter of the circle.

When the target is irradiated with a laser beam, the target is heated, and a plume is generated from the surface of the target to be evaporated. At this time, when the laser beam is irradiated at an angle of 45° with the surface of the target, the plume is generated in a direction perpendicular to the surface of the target. Therefore, it is necessary to set the irradiation position within a range in which the laser beam does not hit the plume and does not pass through a portion other than the target.

Pressure in the production chamber can be used at 13,332.2 hPa (10,000 Torr) or less, but the closer the pressure is to the vacuum, the more easily carbon nanotubes are formed and carbon nanohorn aggregates are not obtained. Preferably at 666.61 hPa (500 Torr) to 1,266.56 hPa (950 Torr), more preferably used in the vicinity of normal pressure (1,013 hPa (1 atm≈760 Torr)) is also suitable for mass synthesis and cost reduction.

The production chamber can be set to any temperature, preferably 0 to 100° C., more preferably used at room temperature is also suitable for mass synthesis and cost reduction.

In the production chamber, the above atmosphere is made by introducing nitrogen gas and a noble gas alone or mixed. These gases can flow from the production chamber to the collection chamber and the material produced can be recovered by this gas flow. It may also be a closed atmosphere by the gas introduced. A flow rate of the atmospheric gas can be used any amount, preferably the flow rate in the range of 0.5 L/min to 100 L/min is appropriate. In the process of evaporation of the target, the gas flow rate is controlled to be constant. To constant gas flow rate can be performed by matching the supply gas flow rate and the exhaust gas flow rate. When performed near atmospheric pressure, it can be performed by exhausting by extruding the gas in the production chamber with the supply gas.

Depending on the amount of catalyst contained in the carbon target, the amount of formation of CNB changes. Although appropriately selected with respect to the amount of catalyst, the amount of catalyst is preferably 0.3 to 20 atomic % (at. %), more preferably 0.5 to 3 at. %. When the amount of catalyst is less than 0.3 at. %, the fibrous carbon nanohorn aggregate becomes very small. Further, when it exceeds 20 at. %, it is not appropriate because the cost increases because the amount of catalyst increases. For the catalyst, Fe, Ni, Co can be used alone, or by mixing. Among them, it is preferable to use Fe (iron) alone, it is particularly preferable in terms of the amount of production of CNB to use a carbon target containing 1 at. % or more 3 at. % or less of iron.

As described above, the formation of CNB is affected by physical properties (thermal conductivity, density, hardness, etc.) of the carbon target containing a catalyst and the content of the catalyst. The catalyst-containing carbon target having low thermal conductivity and low density, and being soft is preferred. That is, the second example embodiment of the present invention is characterized by using a catalyst-containing carbon target having 1.6 g/cm$^3$ or less of the bulk density and 15 W/(m·K) or less of the thermal conductivity. By making bulk density and thermal conductivity in these ranges, it is possible to increase the formation rate of CNB. When bulk density and thermal conductivity exceed these values, the formation rate of CNHs and other carbon structures increases, and the formation of CNBs may be almost eliminated. By using such a target, the energy given from the laser causes the target to evaporate instantaneously to form a dense space in which carbon and catalyst form, and the carbon released from the target is gradually cooled under atmospheric pressure environment to produce CNB.

Bulk density and thermal conductivity can be set a desired value by adjusting the molding pressure and the molding temperature when producing the amount and target of the catalyst metal.

EXAMPLES

The following examples illustrate the present invention in more detail. Of course, the present invention is not limited by the following examples.

Experimental Example 1

Two rectangular prism (rectangular parallelepiped) carbon targets (width: 12 mm, depth: 10 mm, length: 50 mm, bulk density: about 1.4 g/cm$^3$, thermal conductivity: about 5 W/(m·K)) containing 1at. % iron were placed in the grooves of the target fixing jig (made of stainless steel) in the production chamber at intervals of 2 mm between the grooves. The inside of the chamber was set to a nitrogen atmosphere. A first carbon target was continuously irradiated with a $CO_2$ gas laser beam for 30 seconds while the first carbon target was moved at a rate of 0.3 cm/sec. The laser power was 3.2 kW, the spot diameter was 1.5 mm, and the irradiation angle was adjusted to be about 45 degrees at the center of the spot. The flow rate of the nitrogen gas was controlled to be 10 L/min and 700 to 950 Torr. The temperature in the reaction chamber was room temperature.

FIG. 7 is an SEM image of the obtained sample. Fibrous and spherical structures were observed. FIG. 6 is a TEM image. The fibrous and spherical structures were found to be CNB and CNHs, respectively. CNB was found to have single-walled carbon nanohorns with a diameter of 1 to 5 nm and a length of about 40 to 50 nm assembled into fibers. The CNB itself had a diameter of about 30 to 100 nm and a length of several μm to several tens of μm. The black linear structure (arrow α) seen in the CNB is a structure when the graphene sheet (petal) is viewed from its end. The black particles (arrow β) are catalyst metals (Fe).

The second carbon target was evaporated under the same conditions as the first carbon target. From the SEM-image observations of the obtained samples, it was found that CNB and CNHs were generated at the same rate as the first carbon targets. As a result, it was found that CNB can be generated continuously and efficiently.

Comparative Experimental Example 1

A carbon target (width: 15 mm, width: 10 mm, length: 50 mm, bulk density: about 1.0 4 g/cm3, thermal conductivity:

about 5 W/(m·K)) of a rectangular prism (a rectangular parallelepiped) containing 1 at. % iron was fixed to a target fixing jig (one groove made of the same material as in Experimental Example 1) in a production chamber, and two rows of laser radiation were performed at the same intervals as in Experimental Example 1. As a result, the CNB ratio was lowered by the irradiation of the second row.

DESCRIPTION OF REFERENCES

1. Target Fixing Jig
1a. Groove
2. Catalyst-Containing Carbon Target
3. Movement Unit
4. Production Chamber
5. Laser irradiation Window
6. Gas Inlet
7. Conveying Pipe
8. Collection Chamber
9. Gas Exhaust Port
10. Laser Focal Position Adjustment Mechanism
11. Laser Oscillator
12. Collection Container
13. Control Unit

The invention claimed is:

1. A production member comprising a combination of a plurality of carbon targets containing a metal catalyst selected from a single substance of Fe, Ni, Co or a mixture of two or three kinds thereof, which can generate carbon nanohorn aggregates including a fibrous carbon nanohorn aggregate by irradiation of a laser beam, and a target fixing jig for fixing the plurality of the carbon targets,
wherein the target fixing jig has a plurality of grooves for fixing the target to a plate-shaped member,
the carbon target has a thickness of a height equal to or greater than the upper surface of the fixing jig from the groove, and
the width of the carbon target is larger than the size of the spot of the laser beam in the width direction.

2. The production member according to claim 1, wherein the target fixing jig comprises one selected from metals selected from copper, aluminum, tungsten, molybdenum, and chromium, alloys including these metals, ceramics, diamond, or composites with the metals or alloys.

3. The production member according to claim 1, wherein a spot diameter of the laser beam is 0.5 mm to 5 mm, a width of a groove of the fixing jig is 1 mm to 20.5 mm, and a thickness of the target is 1 mm to 20 mm.

4. The production member according to claim 3, wherein an interval between the grooves of the fixing jig is in the range of 1 to 10 mm.

5. The production member according to claim 1, wherein the shape of the target is any one of a quadrangular prism structure, a semi-cylindrical semi-prism structure, and a cylindrical structure that engages with the groove of the fixing jig.

6. The production member according to claim 1, wherein the catalyst is Fe.

7. A method for producing carbon nanohorn aggregates including a fibrous carbon nanohorn aggregate using the production member according to claim 1, the method comprising:
disposing the production member in a production chamber in which a non-oxidizing atmosphere can be maintained,
introducing a gas which maintains the non-oxidizing atmosphere in the production chamber,
continuously irradiating the carbon target fixed to the groove of the fixing jig with a line of laser beam, and then continuously irradiating the carbon target not irradiated with the laser beam fixed to the adjacent groove with a line of laser beam, and
collecting a product produced by the irradiation of the laser beam by the flow of the gas.

8. The method according to claim 7, wherein the production member is arranged by at an angle with respect to the irradiation direction of the laser beam so that the laser beam does not hit a plume generated from the carbon target.

9. A production apparatus of carbon nanohorn aggregates including a fibrous carbon nanohorn aggregate, the apparatus comprising:
a production chamber in which the production member according to claim 1 is movably mounted and in which the inside can be maintained in a non-oxidizing atmosphere;
an irradiation unit irradiating laser beam to the carbon target in the production chamber;
a movement unit moving the production member in the extending direction of the groove and moving the irradiation position of laser beam to an adjacent groove when irradiation of laser beam to the carbon target in one groove is completed; and
collecting unit collecting carbon nanohorn aggregates including the fibrous carbon nanohorn aggregate generated by irradiating the carbon target with laser beam.

* * * * *